(12) United States Patent
Subbaraman et al.

(10) Patent No.: US 11,342,594 B2
(45) Date of Patent: May 24, 2022

(54) MANAGEMENT SYSTEMS AND METHODS FOR SILICON-CONTAINING LITHIUM-ION BATTERIES

(71) Applicant: Robert Bosch GmbH, Stuttgart (DE)

(72) Inventors: Anantharaman Subbaraman, Mountain View, CA (US); Yelena Gorlin, Menlo Park, CA (US); Camille Usubelli, San Jose, CA (US); Rebecca Wilhelm, Ergolding (DE); Farshad Ramezan Pour Safaei, Los Gatos, CA (US); Reinhardt Klein, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 215 days.

(21) Appl. No.: 16/699,218

(22) Filed: Nov. 29, 2019

(65) Prior Publication Data
US 2021/0167426 A1     Jun. 3, 2021

(51) Int. Cl.
    *H02J 7/00*     (2006.01)
    *H01M 10/42*    (2006.01)
    *G01R 31/3835*  (2019.01)
    *H01M 10/0525*  (2010.01)

(52) U.S. Cl.
    CPC ...... *H01M 10/425* (2013.01); *G01R 31/3835* (2019.01); *H01M 10/0525* (2013.01); *H01M 2010/4271* (2013.01)

(58) Field of Classification Search
    USPC .................. 320/130, 131, 132, 133, 134
    See application file for complete search history.

(56) References Cited

U.S. PATENT DOCUMENTS

| | | | |
|---|---|---|---|
| 9,500,713 B1 | 11/2016 | Ghantous et al. | |
| 9,666,859 B2 | 5/2017 | Jung et al. | |
| 2015/0377976 A1* | 12/2015 | Maluf | H02J 7/005 702/63 |
| 2018/0045788 A1* | 2/2018 | Kawai | H01M 10/482 |
| 2019/0120910 A1* | 4/2019 | Ghantous | G01R 31/392 |

FOREIGN PATENT DOCUMENTS

| | | | | |
|---|---|---|---|---|
| CN | 101535827 A | * | 9/2009 | .......... G01R 31/367 |
| CN | 104820188 A | * | 8/2015 | ......... G01R 31/3835 |
| JP | 2015161624 A | * | 9/2015 | |

(Continued)

OTHER PUBLICATIONS

Nitta, Naoki, et al. "Li-ion battery materials: present and future." Materials today 18.5 (2015): 252-264.

(Continued)

*Primary Examiner* — Brian Ngo
(74) *Attorney, Agent, or Firm* — Brooks Kushman P.C.

(57) ABSTRACT

Battery management systems and methods for use with lithium-ion batteries that employ silicon-based negative electrodes. The battery management systems and methods consider the lithiation/delithiation properties of silicon-based anode materials by considering voltage relaxation behavior. The battery management systems and methods may also be applied to other materials that similarly display an apparent hysteresis in the lithiation/delithiation processes and/or form multiple phases with different electrochemical properties.

20 Claims, 15 Drawing Sheets

(56) References Cited

FOREIGN PATENT DOCUMENTS

| KR | 101792537 B1 | * | 11/2017 | |
|---|---|---|---|---|
| WO | WO-2008053410 A2 | * | 5/2008 | ........... G01R 31/367 |
| WO | WO-2013154272 A1 | * | 10/2013 | ............ H02J 7/0063 |
| WO | WO-2014088299 A1 | * | 6/2014 | ......... G01R 31/3842 |

OTHER PUBLICATIONS

Obrovac, M. N., and V. L. Chevrier. "Alloy negative electrodes for Li-ion batteries." Chemical reviews 114.23 (2014): 11444-11502.
Obrovac, M. N., et al. "Alloy design for lithium-ion battery anodes." Journal of The Electrochemical Society 154.9 (2007): A849-A855.
Nagai, R. et al., "Development of Highly Reliable High-capacity Batteries for Mobile Devices and Small-to Medium-sized Batteries for Industrial Applications," Hitachi Review, vol. 60, No. 1, (2011): pp. 28-32.
Verbrugge, Mark, et al. "Fabrication and Characterization of Lithium-Silicon Thick-Film Electrodes for High-Energy-Density Batteries." Journal of The Electrochemical Society 164.2 (2017): A156-A167.
Chevrier, V. L., and Jeff R. Dahn. "First principles studies of disordered lithiated silicon." Journal of the Electrochemical Society 157.4 (2010): A392-A398.
Sethuraman, Vijay A., Venkat Srinivasan, and John Newman. "Analysis of electrochemical lithiation and delithiation kinetics in silicon." Journal of the Electrochemical Society 160.2 (2013): A394-A403.
Sethuraman, Vijay A., et al. "In situ measurements of stress-potential coupling in lithiated silicon." Journal of The Electrochemical Society 157.11 (2010): A1253-A1261.

* cited by examiner

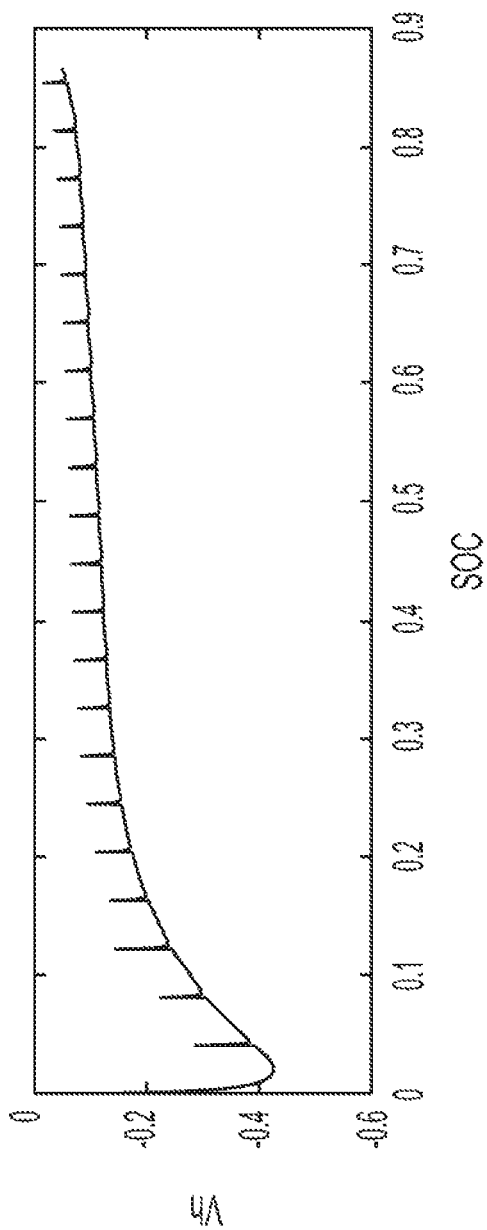
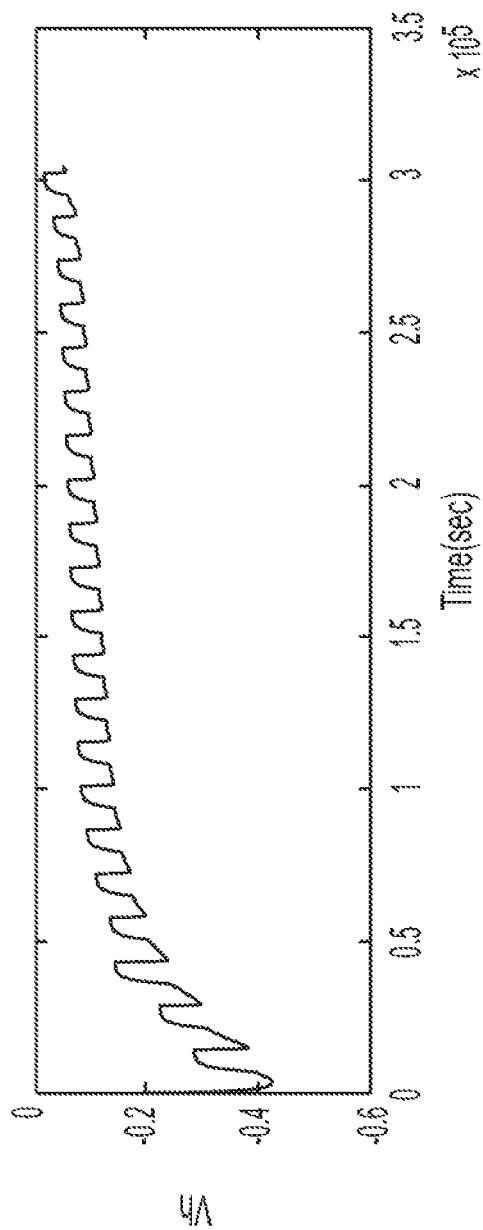
FIG. 4A
FIG. 4B

US 11,342,594 B2

MANAGEMENT SYSTEMS AND METHODS FOR SILICON-CONTAINING LITHIUM-ION BATTERIES

TECHNICAL FIELD

The present disclosure is generally directed to battery management systems and methods for use with lithium-ion batteries. More specifically, the present disclosure relates to management systems for silicon-containing lithium-ion battery cells and associated methods for monitoring and controlling lithium-ion battery operation.

BACKGROUND

Lithium-ion batteries—which operate based on the movement of lithium ions between a negative electrode (the anode) and a positive electrode (the cathode)—have become the industry standard in both electric mobility and portable electronics applications. Today, lithium-ion batteries commonly utilize graphite as the anode material. Graphite intercalates lithium and has a gravimetric capacity of 372 mAh/$g_{graphite}$. Other materials have been identified for potential use in the negative electrode of lithium-ion batteries based in part on their gravimetric capacity characteristics and ability to alloy with lithium. Although silicon (Si) has been identified as one such potential material, its use presents a number of challenges. For example, the use of pure Si as a negative electrode has proven to be challenging due to its significant volume expansion during the lithiation process. Additionally, the creation of efficient battery management systems and methods, which are based on empirical models that accurately reflect the lithiation/delithiation properties of Si-containing anodes, is also squarely among these challenges.

SUMMARY

Embodiments of the disclosure are related battery management systems comprising a processor and a memory storing instructions that, when executed by the processor, cause the battery management system to carry out certain functions. For example, in at least one embodiment, the instructions, when executed by the processor, cause the battery management system to receive (from a sensor) at least one measured parameter of a battery cell having a silicon-containing negative electrode and to determine a first estimated state of charge of the battery cell at a first time based on the at least one parameter by considering a voltage relaxation behavior of the battery cell based at least in part on lithiation or delithiation properties of the silicon-containing negative electrode. When executed by the processor, the instructions further cause the system to determine an estimated parameter of the battery cell based on the at least one measured parameter and the first estimated state of charge of the battery cell and to determine a second estimated state of charge of the battery cell at a second time subsequent to the first time based on the estimated parameter of the battery cell by applying the battery model. Additionally, the instructions, when executed by the processor, cause the battery management system to control the charging or discharging of the battery cell based at least in part on the first and second estimated states of charge of the battery cell.

In accordance with certain embodiments, the system determines the first estimated state of charge of the battery cell based on the at least one measured parameter by applying an equation capturing the evolution of the hysteresis voltage of the battery cell. The determination of the estimated parameter of the battery cell and/or the second estimated state of charge of the battery cell may also, for example, include applying an equation capturing the evolution of the hysteresis voltage of the battery cell. According to at least one embodiment, a suitable equation capturing the evolution of the hysteresis voltage of the battery cell may be defined as follows:

$$\frac{dV_h}{dt} = \beta_1 I(V_{hmax1}(SOC) - \text{sign}(I)V_h) + S_1 * \beta_2(V_{hmax2}(SOC) * S_2 - V_h)$$

where $V_h(t)$ is the hysteresis voltage at time t, I(t) is the applied current at time t, SOC(t) is the state of charge time t, $S_1(t)=0$ if $I(t)\neq 0$ and $S_1(t)=1$ otherwise, $S_2(t)=1$ if $I(t^-)>0$ and $I(t)=0$ or $S_2(t)=-1$ if $I(t^-)<0$ and $I(t)=0$ or $S_2(t)=0$ otherwise, $V_{hmax1}$ is the deviation of outer boundary curve from mean curve as a function of SOC, $V_{hmax2}$ is the deviation of inner boundary curve from mean curve as a function of SOC, $\beta_1$ defines the convergence rate from the inner to outer boundary curve, and $\beta_2$ defines the convergence rate from the outer to inner boundary curve. According to at least one other embodiment, a suitable equation capturing the evolution of the hysteresis voltage of the battery cell may be defined as follows:

$$\frac{dV_h}{dt} = \beta_2 I(V_{hmax2}(SOC) - \text{sign}(I)V_h)$$

where $V_h(t)$ is the hysteresis voltage at time t, I(t) is the applied current at time t, SOC(t) is the state of charge time t, $V_{hmax2}$ is the deviation of inner boundary curve from mean curve as a function of SOC, and $\beta_2$ defines the convergence rate from the outer to inner boundary curve.

In accordance with other embodiments, the system may determine the first estimated state of charge of the battery cell based on the at least one measured parameter includes an equation accounting for amorphous and crystalline phase fractions of one or more materials included in the silicon-containing negative electrode. The determination of the estimated parameter of the battery cell and/or the second estimated state of charge of the battery cell may also, for example, include an equation accounting for amorphous and crystalline phase fractions of one or more materials included in the silicon-containing negative electrode. Applying one or more equations accounting for the amorphous and crystalline phase fractions may include adjusting a model delithiation boundary curve associated with the silicon-containing negative electrode.

In accordance with still other embodiments, the system may determine the first estimated state of charge, the estimated parameter, and/or the second estimated state of charge by applying equations capturing both the evolution of the hysteresis voltage of the battery cell and the amorphous and crystalline phase fractions of one or more materials included in the silicon-containing negative electrode.

Still yet other embodiments of the disclosure are related to methods for operating a lithium-ion battery system, the battery system including at least one battery cell having a silicon-containing negative electrode. In at least one embodiment, for example, the method may be directed to a battery system that further includes one or more sensors configured to measure at least one parameter of the battery cell and a battery management system having a processor and a memory. According to one embodiment, the method includes measuring at least one parameter of the battery cell using a sensor and receiving, by the battery management system, the at least one measured parameter of the battery cell measured by the sensor. The method also includes determining a first estimated state of charge of the battery cell at a first time based on the at least one measured parameter by considering a voltage relaxation behavior of the battery cell based at least in part on lithiation or delithiation properties of the silicon-containing negative electrode. The method also includes determining an estimated parameter of the battery cell based on the at least one measured parameter and the first estimated state of charge of the battery cell. The method also includes determining a second estimated state of charge of the battery cell at a second time subsequent to the first time based on the estimated parameter of the battery cell by applying the battery model. The method also includes controlling the charging or discharging of the battery cell based at least in part on the first and second estimated states of charge of the battery cell.

In accordance with certain embodiments, determining the first estimated state of charge of the battery cell based on the at least one measured parameter includes applying an ordinary differential equation capturing the evolution of the hysteresis voltage of the battery cell. Determining the estimated parameter of the battery cell and/or determining the second estimated state of charge of the battery cell may also, for example, include applying an ordinary differential equation capturing the evolution of the hysteresis voltage of the battery cell. In accordance with other embodiments, determining the first estimated state of charge of the battery cell based on the at least one measured parameter includes applying an equation accounting for amorphous and crystalline phase fractions of one or more materials included in the silicon-containing negative electrode. Determining the estimated parameter of the battery cell and/or determining the second estimated state of charge of the battery cell may also, for example, include applying an equation accounting for amorphous and crystalline phase fractions of one or more materials included in the silicon-containing negative electrode.

BRIEF DESCRIPTION OF THE DRAWINGS

FIGS. 4A and 4B are graphs illustrating the internal state evolution of hysteresis for certain models in accordance with various embodiments;

DETAILED DESCRIPTION

Figure 1:
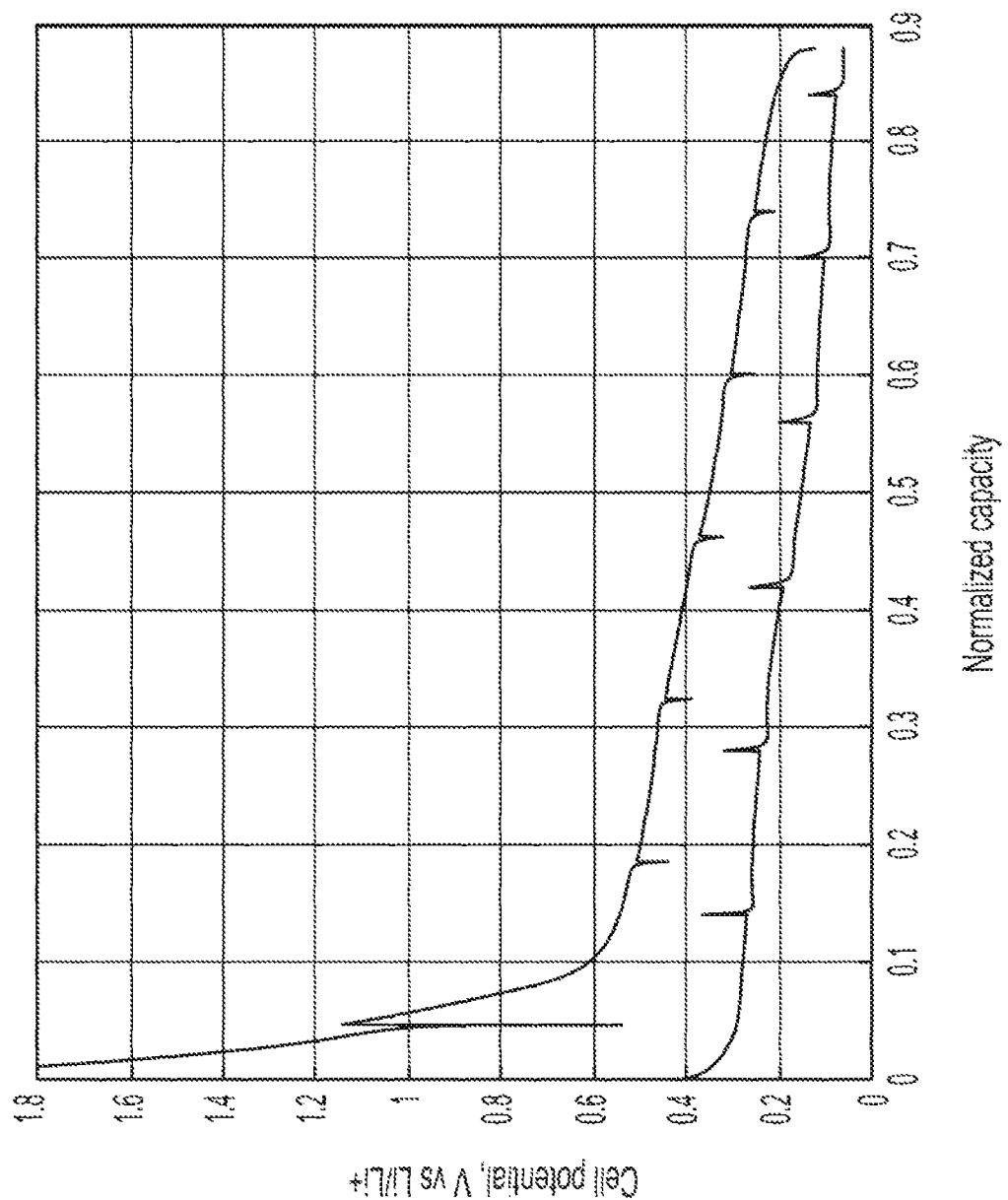
FIG. 1 is a graph depicting experimental data relating to the lithiation and delithiation processes of an Si-based material.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The description of a group or class of materials as suitable for a given purpose in connection with one or more embodiments implies that mixtures of any two or more of the members of the group or class are suitable. Description of constituents in chemical terms refers to the constituents at the time of addition to any combination specified in the description and does not necessarily preclude chemical interactions among constituents of the mixture once mixed.

Except where expressly indicated, all numerical quantities in this description indicating dimensions or material properties are to be understood as modified by the word "about" in describing the broadest scope of the present disclosure.

The first definition of an acronym or other abbreviation applies to all subsequent uses herein of the same abbreviation and applies mutatis mutandis to normal grammatical variations of the initially defined abbreviation. Unless expressly stated to the contrary, measurement of a property is determined by the same technique as previously or later referenced for the same property.

Reference is being made in detail to compositions, embodiments, and methods of embodiments known to the inventors. However, it should be understood that disclosed embodiments are merely exemplary of the present invention which may be embodied in various and alternative forms. Therefore, specific details disclosed herein are not to be interpreted as limiting, rather merely as representative bases for teaching one skilled in the art to variously employ the present invention.

The term "substantially" or "about" may be used herein to describe disclosed or claimed embodiments. The term "substantially" or "about" may modify a value or relative characteristic disclosed or claimed in the present disclosure. In such instances, "substantially" or "about" may signify that the value or relative characteristic it modifies is within ±0%, 0.1%, 0.5%, 1%, 2%, 3%, 4%, 5%, or 10% of the value or relative characteristic.

The combination of high energy and power density exhibited by lithium-ion batteries has made them the default choice for a wide range of applications across numerous industries. In addition to their nearly-ubiquitous use in consumer electronics and electric vehicle applications, the high energy efficiency of lithium-ion batteries may also provide for their effective use in a range of electric grid applications, including improving wind, solar, geo-thermal and other renewable-source energy quality. In accordance with its current widespread use and potential for further expansion, lithium-ion batteries are of intense interest to many industries. To support the continued expansion of lithium-ion battery technology, optimizing the materials, models, and methods employed in conjunction with lithium-ion batteries is a key area of research.

While graphite is regularly used as the negative electrode material in current lithium-ion battery implementations, a number of other materials have now been identified for potential use. Such alternative materials often include beneficial properties such as high gravimetric capacity and the abilities to alloy with and intercalate lithium. While graphite is an abundantly-available, low-cost anode material that exhibits a relatively high gravimetric capacity of 372 mAh/$g_{graphite}$, the low volumetric capacity of commercial graphite electrodes along with certain other limitations, increases the interest in alternative anode materials. Silicon (Si) has been identified as a potential alternative due to its ability to effectively alloy with lithium and to achieve a gravimetric capacity of 3,579 mAh/$g_{Si}$. Although the use of pure Si as a negative electrode has proven challenging due to its 280% volume expansion during the lithiation process, incorporation of a small amount of pure Si—or materials containing Si such as silicon oxide (SiO) or silicon alloys (e.g., $SiB_3$, $Si_2Fe$, $TiSi_2$ and others)—into graphite-based negative electrodes has been demonstrated to increase the electrode's gravimetric capacity.

Known battery management systems (BMS) for lithium-ion batteries that include graphite-based anode materials are based on the graphite approaching thermodynamic equilibrium when cycled at slow rates. However, Si maintains a significant voltage gap between its lithiation and delithiation curves even at extremely slow rates. Accordingly, there is a need to account for this apparent hysteresis displayed by Si-based materials and the possibility of multiple delithiation curves in the same state of charge (SOC) range due to crystal structure changes that take place within such materials. There is also a need for battery management systems configured to be used with lithium-ion batteries having silicon-containing negative electrodes. Such battery management systems should properly reflect the lithiation/delithiation properties of the silicon-containing anode materials and accurately capture their voltage relaxation behavior. These battery management systems may properly account for the delithiation behavior of silicon-containing anode materials in the presence or absence of a crystal structure change.

The battery management systems disclosed herein account for the lithiation/delithiation properties of Si-based materials by capturing their voltage relaxation behavior associated with the apparent hysteresis in the lithiation/delithiation processes and their delithiation behavior in the presence or absence of a crystal structure change. Accordingly, the disclosed battery management systems accurately capture the input-output behavior during cycling of Si-containing negative electrodes and thereby enable improved voltage prediction and increase the accuracy of both SOC estimation and power prediction. Furthermore, the disclosed battery management systems allow for improvements in the performance of fast charging algorithms by utilizing states that reflect crystal structure change or apparent hysteresis in the cost function for deriving optimal charging protocols.

More specifically, in addition to accurately reflect the input-output behavior of Si-based materials during battery cycling, the battery management systems disclosed herein properly capture relaxation effects during current interrupted slow cycling of Si-based materials, crystal structure change during battery charging when the Si-based materials are lithiated, and allow for the possibility of multiple delithiation curves in the same SOC range due to crystal structure changes. Beyond these particular benefits, the battery management systems described herein provide for improved state of health (SOH) estimation and facilitate better design and evaluation of fuel cell arrangements.

While the disclosed battery management systems focus on silicon-containing anode materials, they can also be effectively applied to other materials that similarly display an apparent hysteresis in the lithiation/delithiation processes and/or form multiple phases with different electrochemical properties. Additionally, while the present disclosure focuses on lithium-ion batteries, the described systems may also be effectively applied to other types of batteries that include negative electrodes containing Si, Si-based materials (e.g., SiO and Si alloys), and/or other similar materials exhibiting apparent hysteresis (or undergo a crystal structure change) during the lithiation/delithiation processes. Such additional battery types include, but are not limited to, sodium (Na)-ion and magnesium (Mg)-ion batteries.

As noted above, the electrochemical behavior of batteries that include Si-based materials in the negative electrode diverges significantly from that of batteries containing solely graphite in the negative electrode. Additionally, Si can transform from amorphous to crystalline phase, if lithiated to stoichiometry of $Li_{x>3.5}Si$, which results in a different delithiation curve than if material is lithiated to stoichiometry of $Li_{x<3.5}Si$. Several theories have been proposed to explain the origin of apparent hysteresis and crystal structure change. These include, among others, a small exchange current density for the reaction (V. A. Sethuraman, V. Srinivasan and J. Newman, "Analysis of Electrochemical Lithiation and Delithiation Kinetics in Silicon," *Journal of The Electrochemical Society*, vol. 160, no. 2, pp. A394-A403, 2013) and mechanical energy dissipation due to plastic deformation of the lithiated material (V. A. Sethuraman, V. Srinivasan, A. F. Bower and P. R. Guduru, "In Situ Measurements of Stress-Potential Coupling in Lithiated Silicon," *Journal of The Electrochemical Society*, vol. 157, no. 11, pp. A1253-A1261, 2010). Additionally, formation energies calculated by DFT have also been used to justify the change in the delithiation curve due to a crystal structure change (V. L. Chevrier and J. R. Dahn, "First Principles Studies of Disordered Lithiated Silicon," *Journal of the Electrochemical Society*, vol. 157, no. 4, pp. A392-A398, 2010.). Determining which theory or combination of theories correctly explain the observed electrochemical phenomena would allow for a construction of a physics-based model, which can be applied to novel battery management systems in order to precisely describe the cycling behavior of batteries with Si-based anode materials. However, parameterization of a physics-based model would be difficult and the use of such a model for real time model-based estimation and control in a BMS would increase the computational complexity of the software.

As further detailed below, the battery management systems described herein in one or more embodiments capture the apparent hysteresis properties of Si-based materials through the introduction of boundary curves defined by three variables: $U_{avg}$, $U_{max}$, and k. $U_{avg}$ is the average value between lithiation and delithiation potential for a given SOC. $U_{max}$ is the maximum potential associated with an apparent hysteresis. And, k is an adjustable constant that describes how quickly the system returns to a boundary curve after initialization at a particular SOC. There are a number of deficiencies that are overcome by the battery management systems described herein. For example, Verbrugge et al. in "Fabrication and Characterization of Lithium-Silicon Thick-Film Electrodes for High-Energy-Density Batteries," *Journal of The Electrochemical Society*, vol. 164, no. 2, pp. A156-A167, 2017, describes only apparent hysteresis during slow-rate, constant-current cycling and does not have mechanisms to treat the state of the system during relaxation periods when current is set to 0. Moreover, Verbrugge et al. also fails to account for conditions in which the cell potential is constant. As a result, Verbrugge et al. fails also to provide a complete description of the electrochemical properties of Si/Si-based materials and thus cannot be directly used to characterize the charging/discharging behavior of Si-containing negative electrodes without introducing errors. The battery management systems disclosed herein overcome these and/or other shortcomings.

In accordance with one or more embodiments herein, the battery management systems and methods address one or more deficiencies associated with preexisting systems and methods to accurately capture the lithiation/delithiation properties of Si-containing anode materials by properly accounting for voltage relaxation effects during slow cycling of such materials. As demonstrated by the experimental data shown in FIG. 1, as current is turned off and back on, the half-cell potential of a Si-based material changes between two boundary curves: an outer boundary curve and an inner boundary curve. Accordingly, battery management systems and methods disclosed herein incorporate inner and outer boundary curves to accurately describe the behavior of Si-based materials in the presence (and absence) of applied current.

The experimental data shown in FIG. 1 captures the lithiation and delithiation of Si-coating vs. Li/Li$^+$ performed with a C-rate of C/50—i.e., 50 hours to complete lithiation and 50 hours to complete delithiation, without counting the time of rests—and six 12-hour rest steps during each process. Embodiments of the disclosed models and systems capture such lithiation/delithiation properties of the Si-based material by coupling the inner and outer boundary curves through the use of the parameters and functions set forth in Table 1 below.

TABLE 1

Descriptions of Model Parameters and Functions - Coupled Inner and Outer Boundary Curves

| Parameter/Function | Description |
| --- | --- |
| $V_{mean}$: [0, 1] → $R_{\{\geq 0\}}$ | Mean between outer charge/discharge boundary curves; $V_{mean}$ is a function of SOC |
| $V_{hmax1}$: [0, 1] → $R_{\{\geq 0\}}$ | Deviation of outer boundary curve from mean curve as a function of SOC |
| $V_{hmax2}$: [0, 1] → $R_{\{\geq 0\}}$ | Deviation of inner boundary curve from mean curve as a function of SOC |
| $\beta_1$ | Parameter to define convergence rate/transient from inner to outer boundary curve |
| $\beta_2$ | Parameter to define convergence rate/transient from outer to inner boundary curve |

Figure 2:
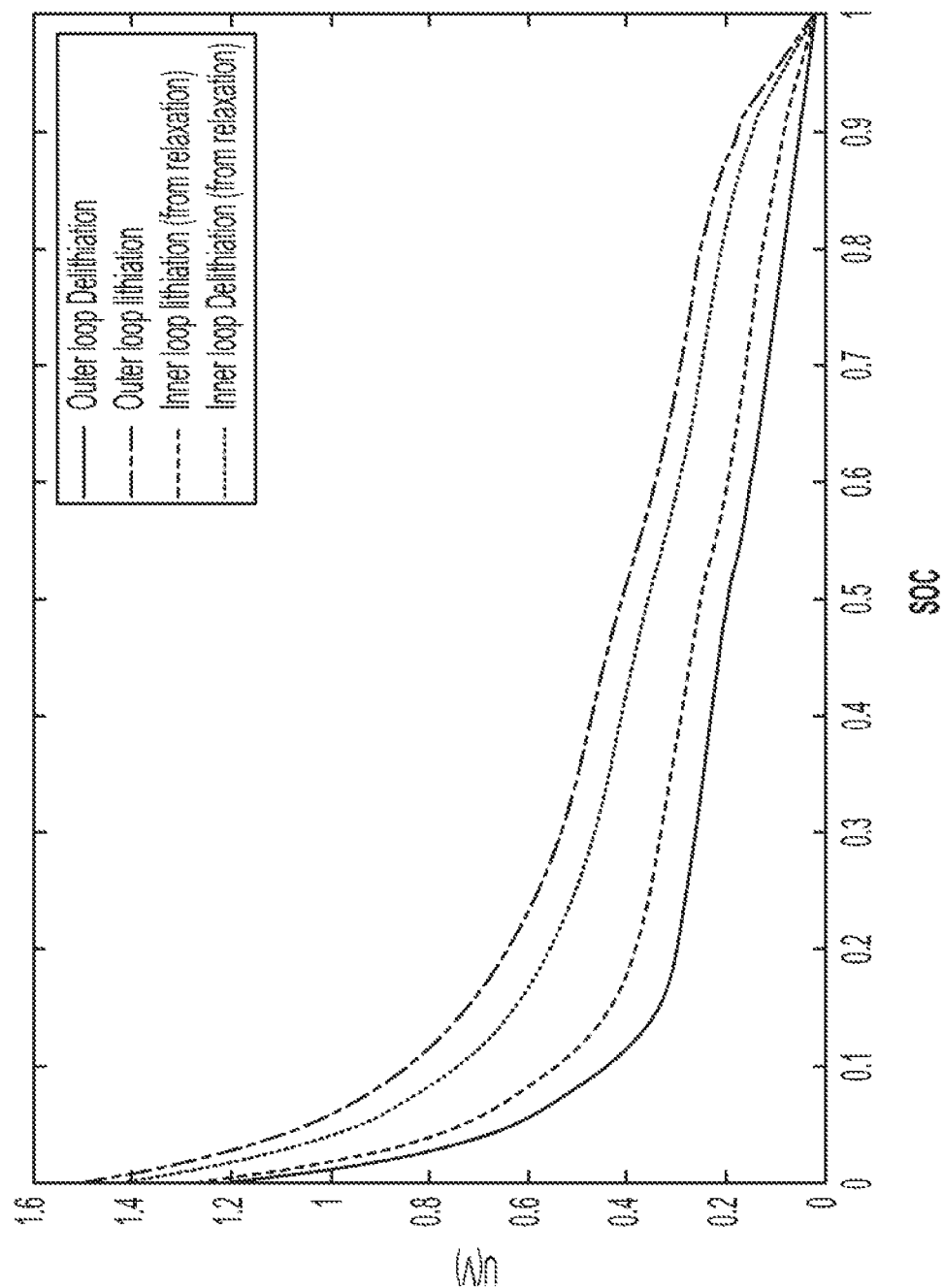
FIG. 2 is a graph illustrating the approach used to capture voltage relaxation effects during slow cycling of Si-based materials in accordance with certain embodiments.
Figure 3A:
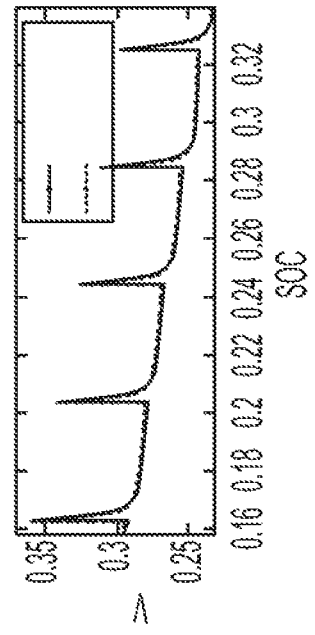
FIGS. 3A to 3F are graphs comparing model predictions to experimental data during lithiation of Si-based anode materials in accordance with certain embodiments.
Figure 3B:
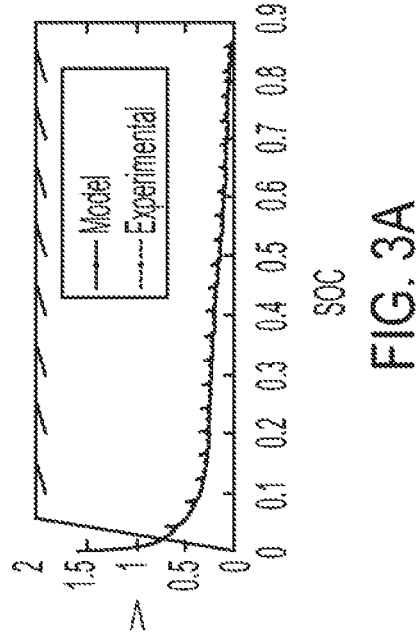
Figure 3C:
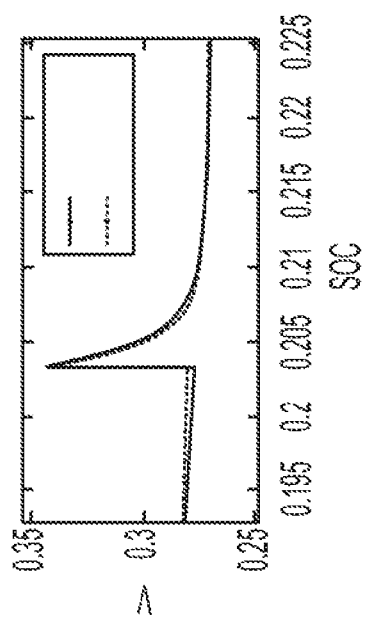
Figure 3D:
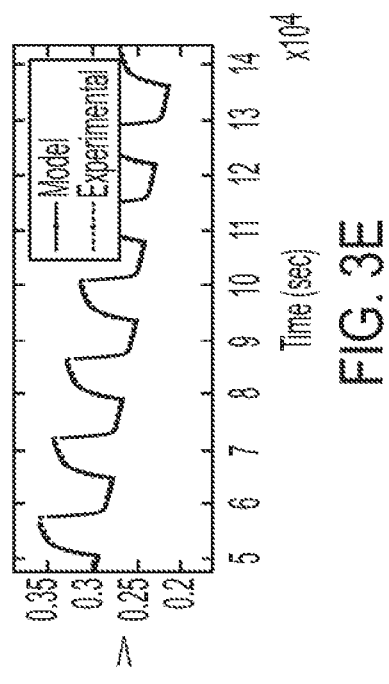
Figure 3E:
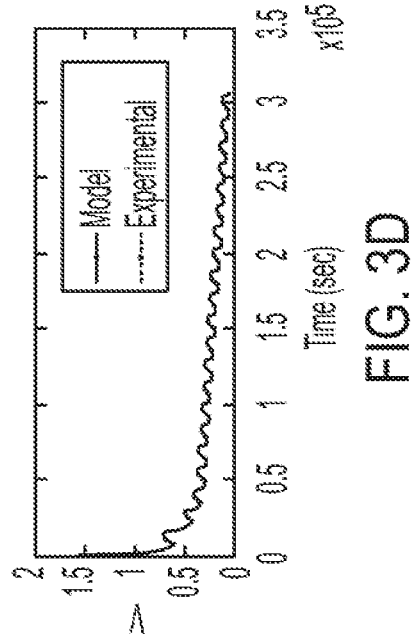
Figure 3F:
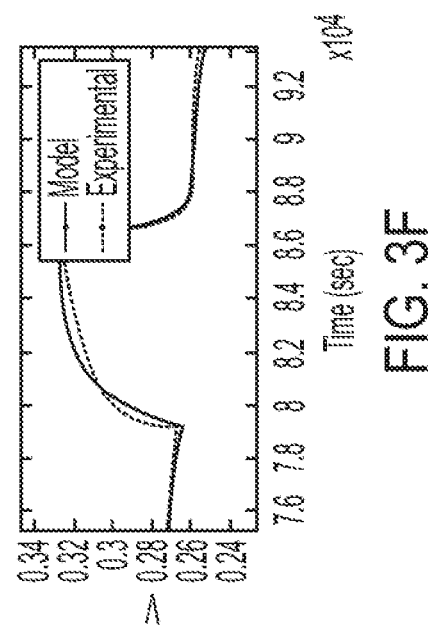
Figure 5B:
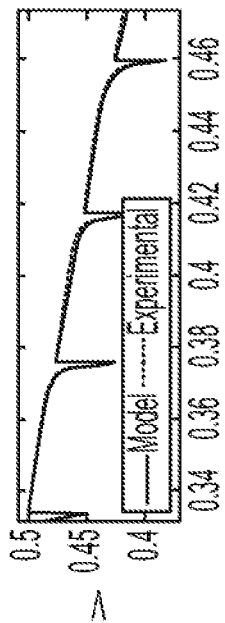
FIGS. 5A to 5F are graphs comparing model predictions to experimental data during delithiation of Si-based anode materials in accordance with certain embodiments.
Figure 5E:
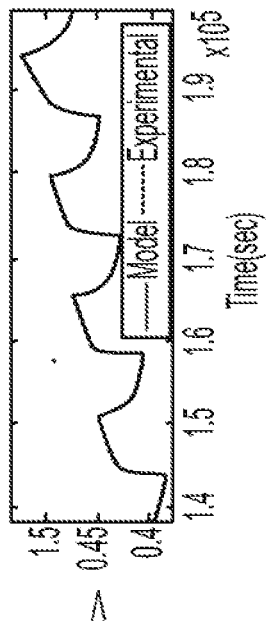
Figure 5A:
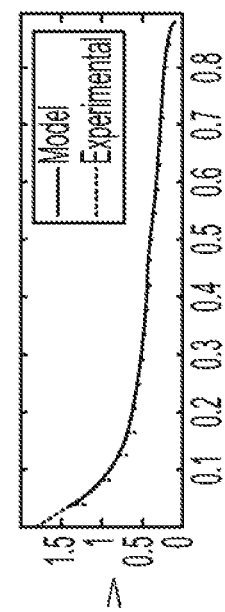
Figure 5D:
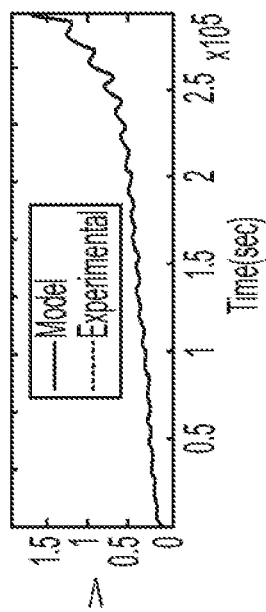
Figure 5C:
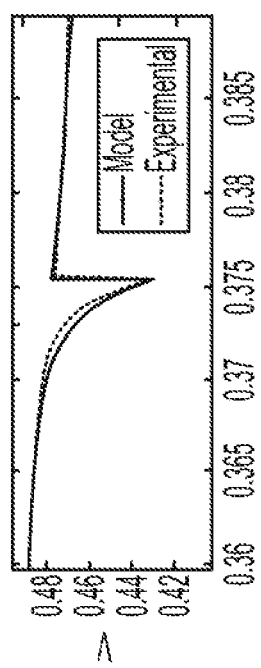
Figure 5F:
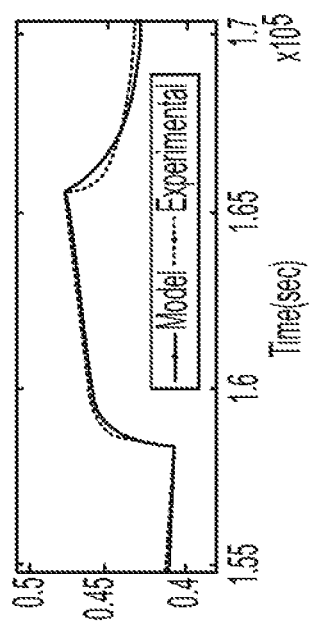

Utilizing the parameters and functions set forth in Table 1 provides the ability to define the mean, inner and outer boundary curves as a function of the SOC. This approach is illustrated in FIG. 2 by the inner and outer lithiation and delithiation curves. If $V_h(t)$ denotes the value of the hysteresis voltage at time t and with initial condition $V_h(0)$, then the evolution of the hysteresis voltage is given by the following ordinary differential equation (I):

$$\frac{dV_h}{dt} = \beta_1 I(V_{hmax1}(SOC) - \text{sign}(I)V_h) + S_1 * \beta_2(V_{hmax2}(SOC) * S_2 - V_h)$$

$$V_{cell}(t) = V_{mean}(SOC(t)) + V_h(t)$$

where I is the applied current and SOC(t) is the state of charge of the Si-based material. $S_1(t)$ is calculated according to the magnitude of current—such that $S_1(t)=0$ if $I(t) \neq 0$ and $S_1(t)=1$ otherwise. $S_2(t)$ is calculated based on the transition of current from positive or negative value to zero—such that $S_2(t)=1$ if $I(t^-)>0$ and $I(t)=0$ or $S_2(t)=-1$ if $I(t^-)<0$ and $I(t)=0$ or $S_2(t)=0$ otherwise. The total half-cell potential $V_{cell}$ is a combination of $V_{mean}$ and the hysteresis contribution $V_h$. The parameters $\beta_1$, $\beta_2$ are tuned to match the experimental data in terms of the rate of convergence of the half-cell potential between the inner and outer boundary curves. These parameters are used in one or more battery management systems and methods disclosed herein, which accurately capture the voltage relaxation behavior of Si-based anode materials.

According to other embodiments, the systems and methods can be adjusted to model the signal $S_1(t)$ not as an indicator of zero current (singleton set), but rather as an indicator function of a set $(-\varepsilon \leq I \leq +\varepsilon)$ for some $\varepsilon > 0$. Such an adjustment may allow for even greater agreement between calculated and experimental data as it expands the potential modes captured by the signal $S_1(t)$ beyond simply the presence or absence of applied current.

As shown in FIGS. 3A to 3F, voltage predictions resulting from models employing ordinary differential equation (I) closely match experimental data during lithiation with current interrupt. In light of this ability to properly reflect experimental voltage relaxation behavior during slow cycling, systems and associated models based on equation (I) may be used to effectively capture the lithiation properties of Si-containing anode materials. FIGS. 4A and 4B are graphs illustrating the internal state evolution of hysteresis for models employing equation (I).

Furthermore, as demonstrated by the graphs shown in FIGS. 5A to 5F, voltage predictions resulting from models employing equation (I) also closely match experimental data during delithiation with current interrupt. Accordingly, systems and methods based on equation (I) may be used to effectively capture both the lithiation and delithiation properties of Si-containing anode materials.

Additionally, in accordance with other embodiments, the systems and methods capture the lithiation/delithiation properties of Si-containing anode materials—while properly accounting for voltage relaxation effects during slow cycling of such materials—without explicitly considering two hysteresis loops. Instead, the disclosed systems and methods consider only an inner loop and capture the transition between the inner and outer loops through a parallel RC circuit element. The time constants associated with the RC element then relate to the convergence rate between the inner and outer loop and the values of the resistance R captures information about both the outer and inner loop. Table 2 below sets forth the parameters and functions used in accordance with such an approach.

TABLE 2

Descriptions of Model Parameters and Functions - Coupled Inner Boundary Curve and Equivalent Circuit

| Parameter/Function | Description |
|---|---|
| $V_{mean}: [0, 1] \to R_{\{\geq 0\}}$ | Mean between outer charge/discharge boundary curves; $V_{mean}$ is a function of SOC |
| $V_{hmax1}: [0, 1] \to R_{\{\geq 0\}}$ | Deviation of outer boundary curve from mean curve as a function of SOC |
| $V_{hmax2}: [0, 1] \to R_{\{\geq 0\}}$ | Deviation of inner boundary curve from mean curve as a function of SOC |
| $R_1: [0, 1] \to R_{\{\geq 0\}}$ | Resistance as a function of SOC |
| $\tau: R_{\{\geq 0\}} \to R_{\{\geq 0\}}$ | Time constant function (function of magnitude of current) |
| $\beta_2$ | Parameter to define convergence rate/transient from outer to inner boundary curve |

If $V_h(t)$ denotes the value of the hysteresis voltage at time t and with initial condition $V_h(0), i_1(0)$, then the evolution of the hysteresis voltage is given by the following ordinary differential equation (II):

$$\frac{dV_h}{dt} = \beta_2 I(V_{hmax2}(SOC) - \text{sign}(I)V_h) \quad \text{(II)}$$

$$\frac{di_1}{dt} = (I - i_1)/\tau(|I|)$$

$$V_{cell}(t) = V_{mean}(SOC(t)) + V_h(t) + \frac{i_1}{I} R_1(SOC) \text{ if } I \neq 0$$

$$V_{cell}(t) = V_{mean}(SOC) + V_h(t), \text{ otherwise}$$

where I is the applied current and SOC(t) is the state of charge of the Si-based material. The resistance $R_1$ is defined as a function according to $R_1(SOC)=f(V_{hmax1}(SOC),V_{hmax2}(SOC))$. Typically, the function is parameterized from experimental data and takes the form $f:=(V_{hmax1}(SOC)-V_{hmax2}(SOC))$. The time constant is a function of the magnitude of the current to account for the different convergence behavior in the presence or absence of current. The total half-cell potential $V_{cell}$ is a combination of $V_{mean}$ the hysteresis contribution $V_h$ and the potential drop due to the RC element. The parameter $\beta_2$ and the function r are tuned to match the experimental data in terms of the rate of convergence of the half-cell potential between the inner and outer boundary curves.

Figure 6B:
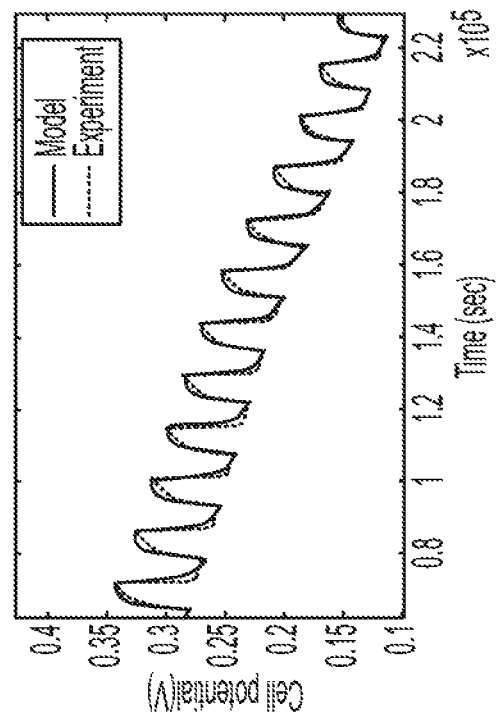
FIGS. 6A and 6B are graphs comparing model predictions to experimental data during lithiation of Si-based anode materials in accordance with certain embodiments.
Figure 6A:
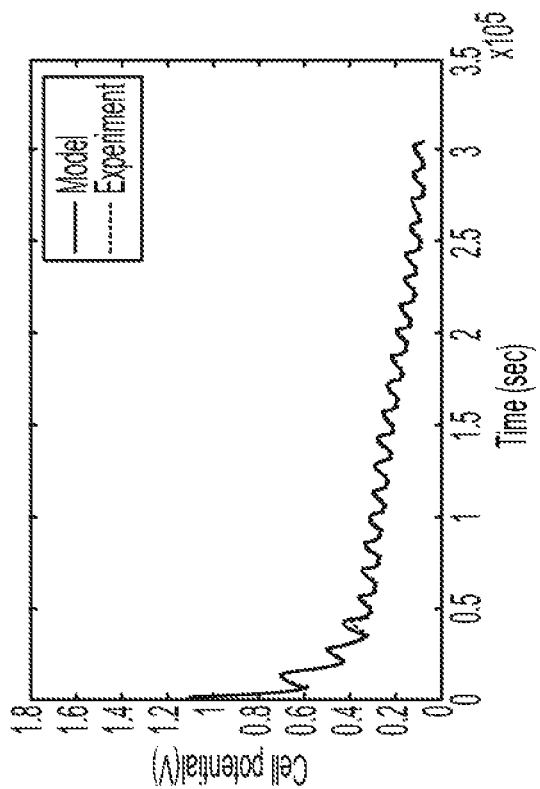
Figure 7A:
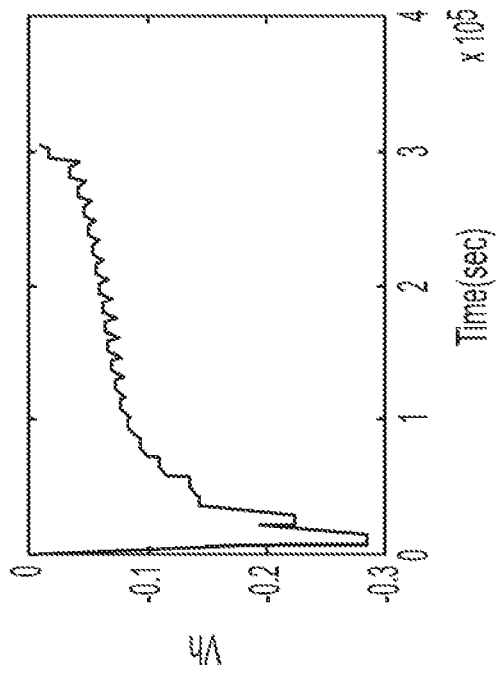
FIGS. 7A to 7D are graphs illustrating the internal state evolution of hysteresis for certain models in accordance with various embodiments.
Figure 7B:
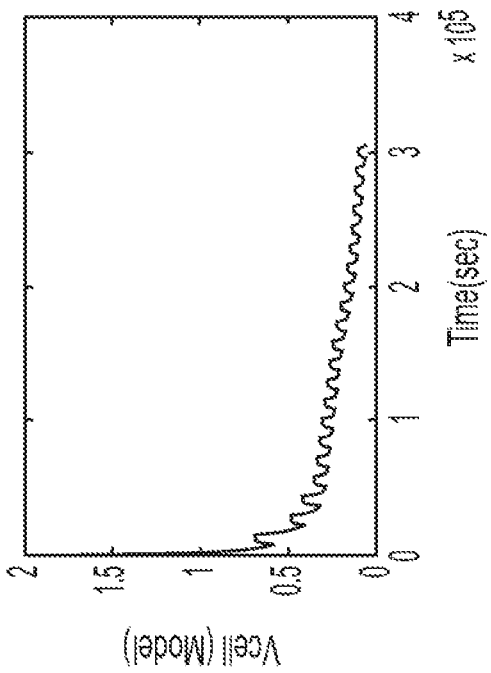
Figure 7C:
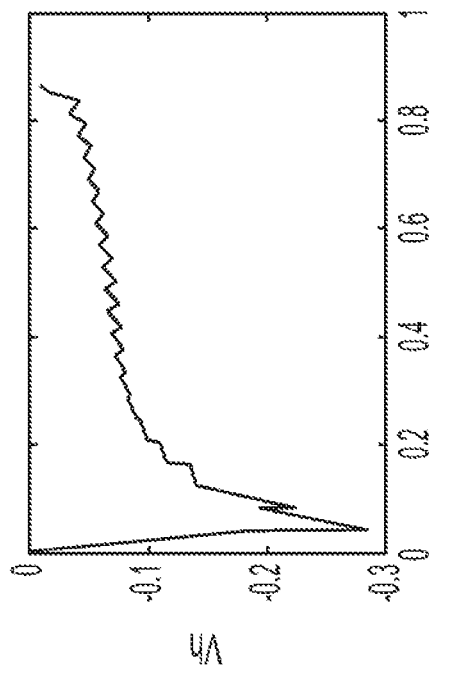
Figure 7D:
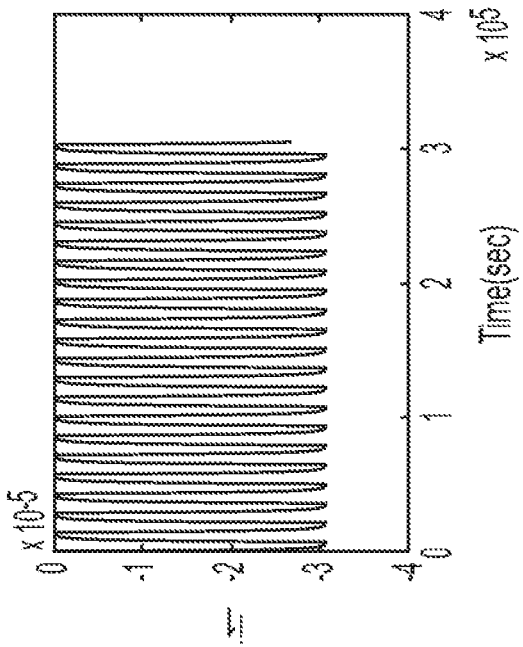

As shown in FIGS. 6A and 6B, voltage predictions resulting from models employing differential equation (II) also closely match experimental data during lithiation with current interrupt. In light of this ability to properly reflect experimental voltage relaxation behavior during slow cycling, systems and processes based on equation (II) may be used to effectively capture the lithiation properties of Si-containing anode materials. FIGS. 7A to 7D are graphs illustrating the internal state evolution of hysteresis for models employing equation (II).

According to other embodiments, implementation of the model equations in systems and processes can be adjusted to unify the conditions relating to the presence or absence of applied current. Such an adjustment yields the following ordinary differential equation (III) capturing the evolution of the hysteresis voltage:

$$\frac{dV_h}{dt} = \beta_2 I(V_{hmax2}(SOC) - \text{sign}(I)V_h) \quad \text{(III)}$$

$$\frac{di_1}{dt} = (\text{sign}(I) - i_1)/\tau(|I|)$$

$$V_{cell}(t) = V_{mean}(SOC(t)) + V_h(t) + i_1 * R_1(SOC)$$

where by definition sign(0)=0.

Figure 8:
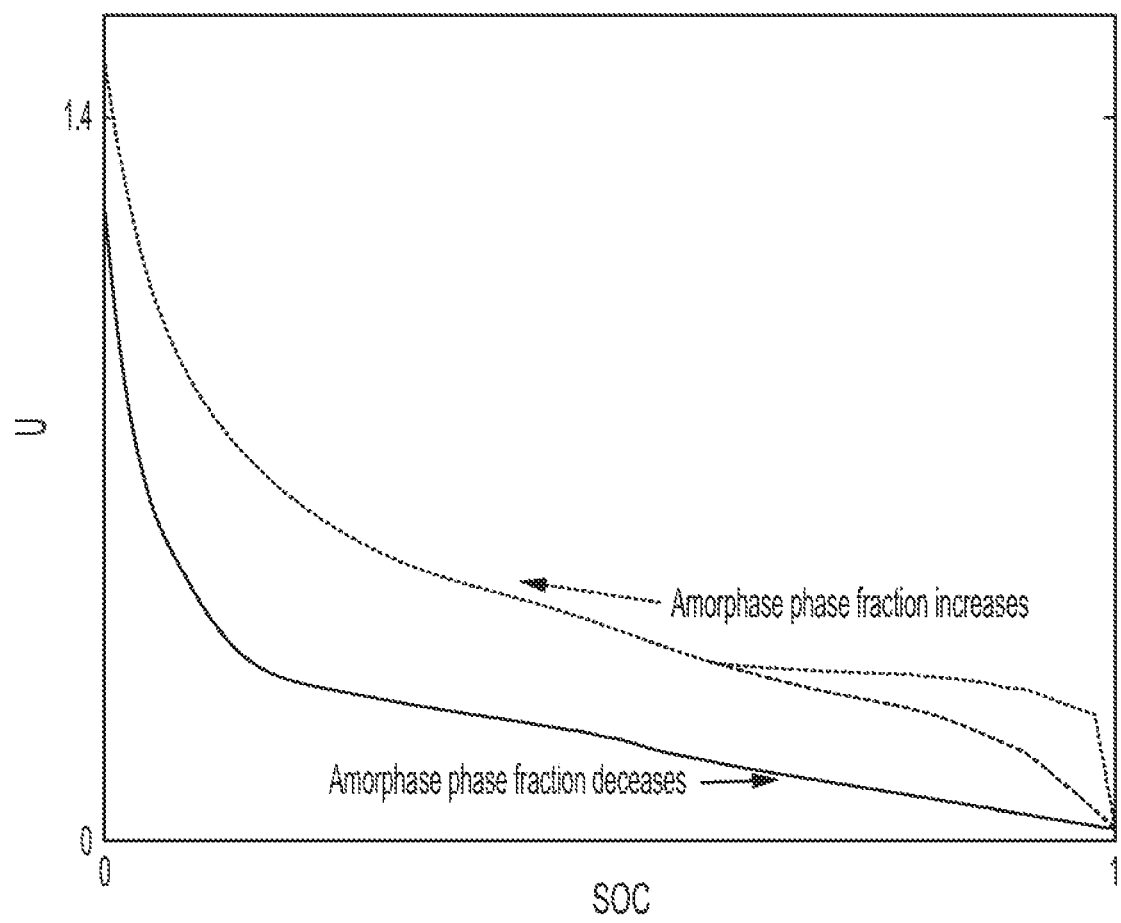
FIG. 8 is a graph depicting the impact of phase change on the delithiation boundary curves of an Si-based material.

In one or more embodiments, systems and methods are disclosed that properly account the delithiation behavior of silicon-containing anode materials in the presence or absence of a crystal structure change. As illustrated in FIG. 8, if lithiation proceeds beyond the stoichiometry of $Li_{3.5}Si$—which typically corresponds to a potential in 70-50 mV range—then the de-lithiation curve obtained is significantly different from that in which the lithiation stoichiometry corresponds to $Li_{x<3.5}Si$. FIG. 8 depicts the boundary curves for Si-based anode materials corresponding to delithiation of an amorphous phase and delithiation of a crystalline phase. The change in the delithiation curve can be attributed to the change in the crystal structure from an amorphous state to a crystalline state. Not capturing this effect leads to significant mismatch in the state of charge and voltage prediction directly affecting the performance of the battery management system. Accordingly, one or more embodiments accurately use this effect in battery management systems and processes.

In one or more embodiments, the battery management systems and processes consider both the amorphous and crystalline phase fractions of Si-based material. These phase fractions can be referred to as $\gamma_a$ and $\gamma_c$, respectively. Since there are only two phases present, the following relation is true: $\gamma_a+\gamma_c=1$. In one or more embodiments, the battery management systems and processes consider the evolution of at least one state, in which the other state can be calculated based on the constraint equation. The following ordinary differential equation (IV) can be used for this purpose:

$$\frac{d\gamma_a}{dt} = F(\gamma_a, V, SOC, \text{sign}(I)) \quad \text{(IV)}$$

Figure 9:
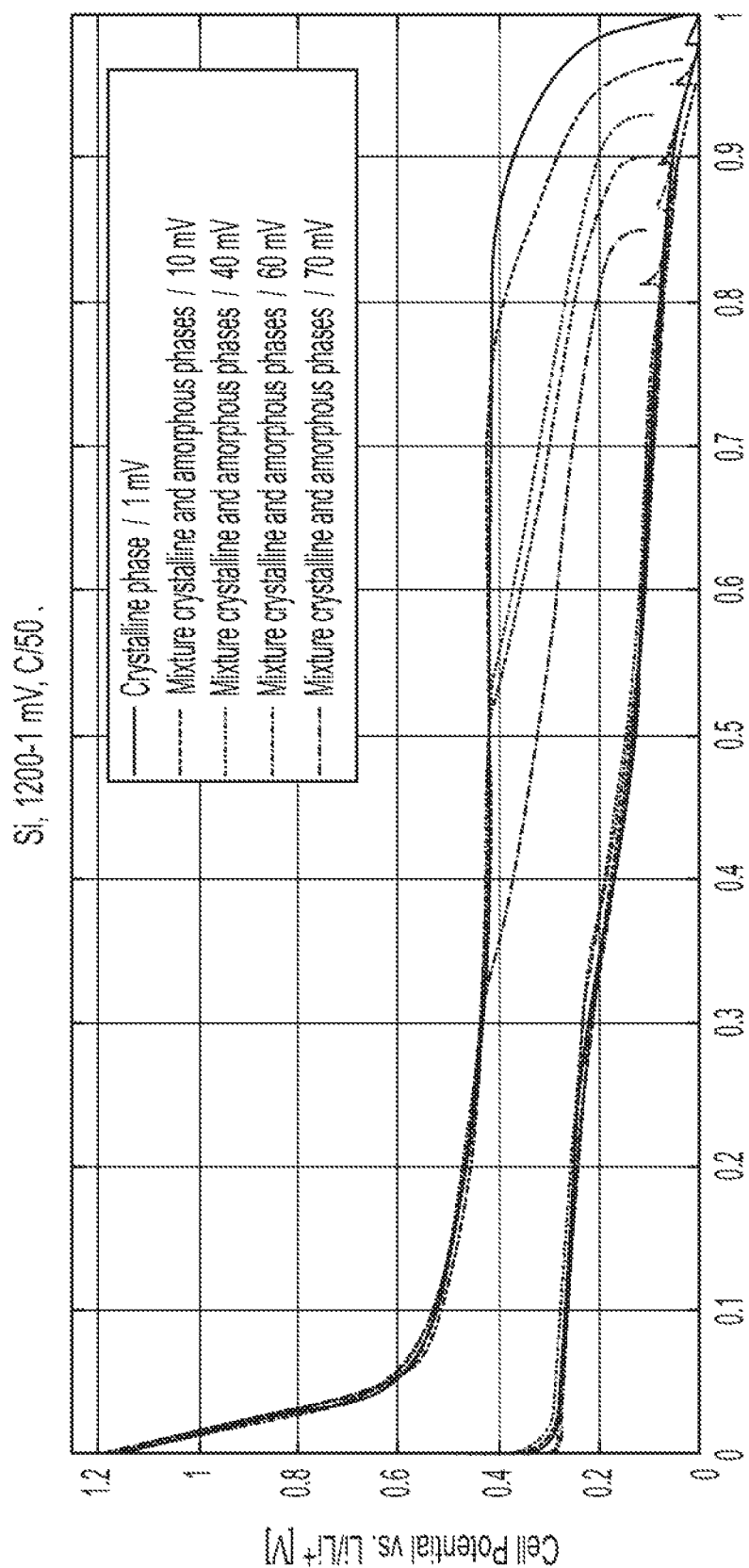
FIG. 9 is a graph of experimental data demonstrating the impact of phase change on delithiation boundary curves for a silicon half-cell.

The function F determines conditions such that $\gamma_a$ is constrained to evolve within the interval [0,1], and conditions for when $\gamma_a \to 1$ or $\gamma_a \to 0$. The function is parameterized based on experimental observations, shown in FIG. 9, which demonstrate not only delithiation curves corresponding to purely amorphous and crystalline phases, but also delithiation curves in the presence of different mixtures of both phases. Specifically, FIG. 9 shows experimental data demonstrating the impact of phase change on delithiation boundary curves for a silicon half-cell. Five curves are demonstrated, each to a different lithiation limit ranging from 70 mV to 1 mV, with the lithiation curve to 70 mV corresponding to a case with no phase change. As demonstrated by the experimental data shown in FIG. 9, if the cell potential remains above 70 mV during lithiation, only the amorphous phase is present. Alternatively, if the cell potential decreases below 70 mV, crystalline phase is formed. The ratio of the amorphous and crystalline phases depends on the potential reached below 70 mV. Depending on the magnitude of the cell potential, a spectrum of delithiation curves are measured. The closer the delithiation potential is to zero, the higher is the deviation from the amorphous delithiation curve.

In order to accurately capture the changes in the delithiation boundary curves demonstrated in FIG. 9, the battery management systems and methods of one embodiment track the phase fractions between the amorphous and crystalline phases. The following ordinary differential equation (V) can be used for this purpose:

$$\frac{d\gamma_a}{dt} = \gamma_a(1 - \gamma_a)f(V, \text{sign}(I)) \quad (V)$$

Figure 10:
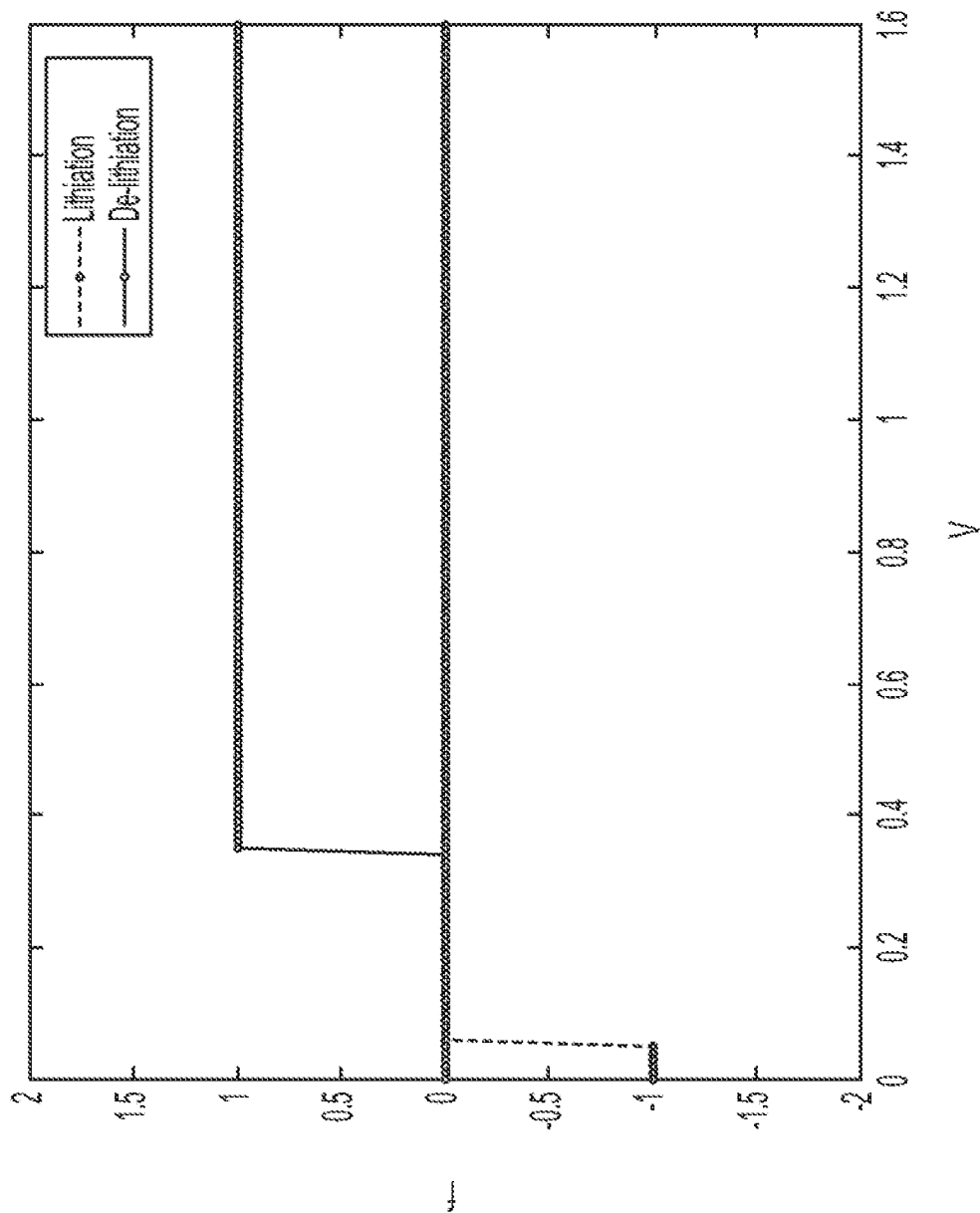
FIG. 10 depicts a function for tracking Si-based material phase fractions between the amorphous and crystalline phases of an Si-based anode material.
Figure 11A:
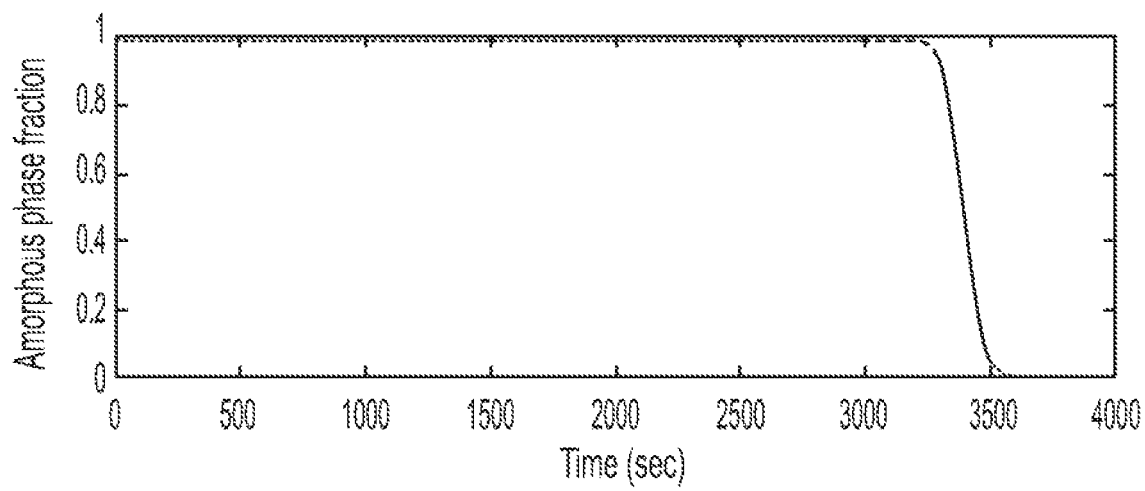
FIGS. 11A and 11B are graphs showing an example of time evolution of the amorphous phase fraction and half-cell potential.
Figure 11B:
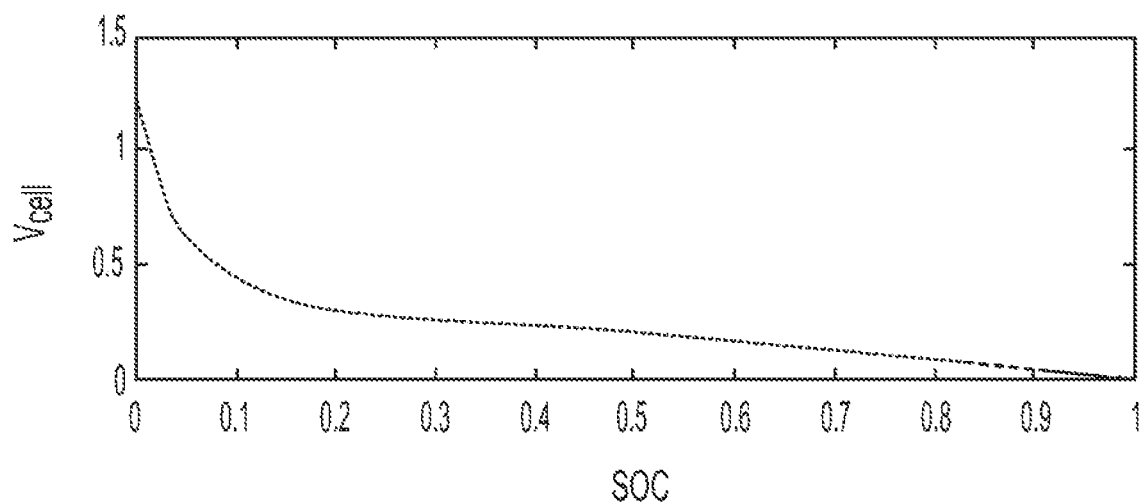

FIG. 10 illustrates the function $f$. As demonstrated by FIG. 10, $\{0\}$, $\{1\}$ are equilibrium points for the system. Consequently, starting from $\gamma_a(0) \in [0,1]$, the state $\gamma_a$ (and by definition $\gamma_c$) are constrained to evolve within $[0,1]$. The sign of F determines the stability of the points $\{0\}$, $\{1\}$, which determines the conditions for when $\gamma_a \rightarrow 1$ or $\gamma_a \rightarrow 0$ and the magnitude of F determines the rate at which the state converges to the equilibrium point. Additionally, these constraints can be expanded to consider the impact on the different phases of time spent in a certain voltage regime, by adding a counter state that is activated beyond a certain time elapsed. Such a counter state can then be utilized to change the crystalline or amorphous phase fraction according to experimental observations. Simulation results in connection with this augmented approach are set forth in FIGS. 11A and 11B, which show an example of time evolution of the amorphous phase fraction and half-cell potential.

In accordance with certain embodiments, the proposed battery management systems and methods for accurately determining the lithiation/delithiation properties of Si-containing anode materials may modify the delithiation boundary curve based on crystal structure change. In one or more embodiments, the delithiation boundary curve is adjusted based on the phase fraction $\gamma_a$. $V_{hmax,a}$, $C_{hmax,c}$ may respectively denote the delithiation boundary curves for the amorphous state and the crystalline state of the Si-based material. Accordingly, the resultant delithiation boundary curve is based a combination of $V_{hmax,a}$, $V_{hmax,c}$ as described by the following ordinary differential equation (VI):

$$V_{hmax,mixed}(SOC) = \min\left(\frac{V_{hmax,a}(SOC)}{h(\gamma_a)}, V_{hmax,c}(SOC)\right) \quad (VI)$$

Figure 12:
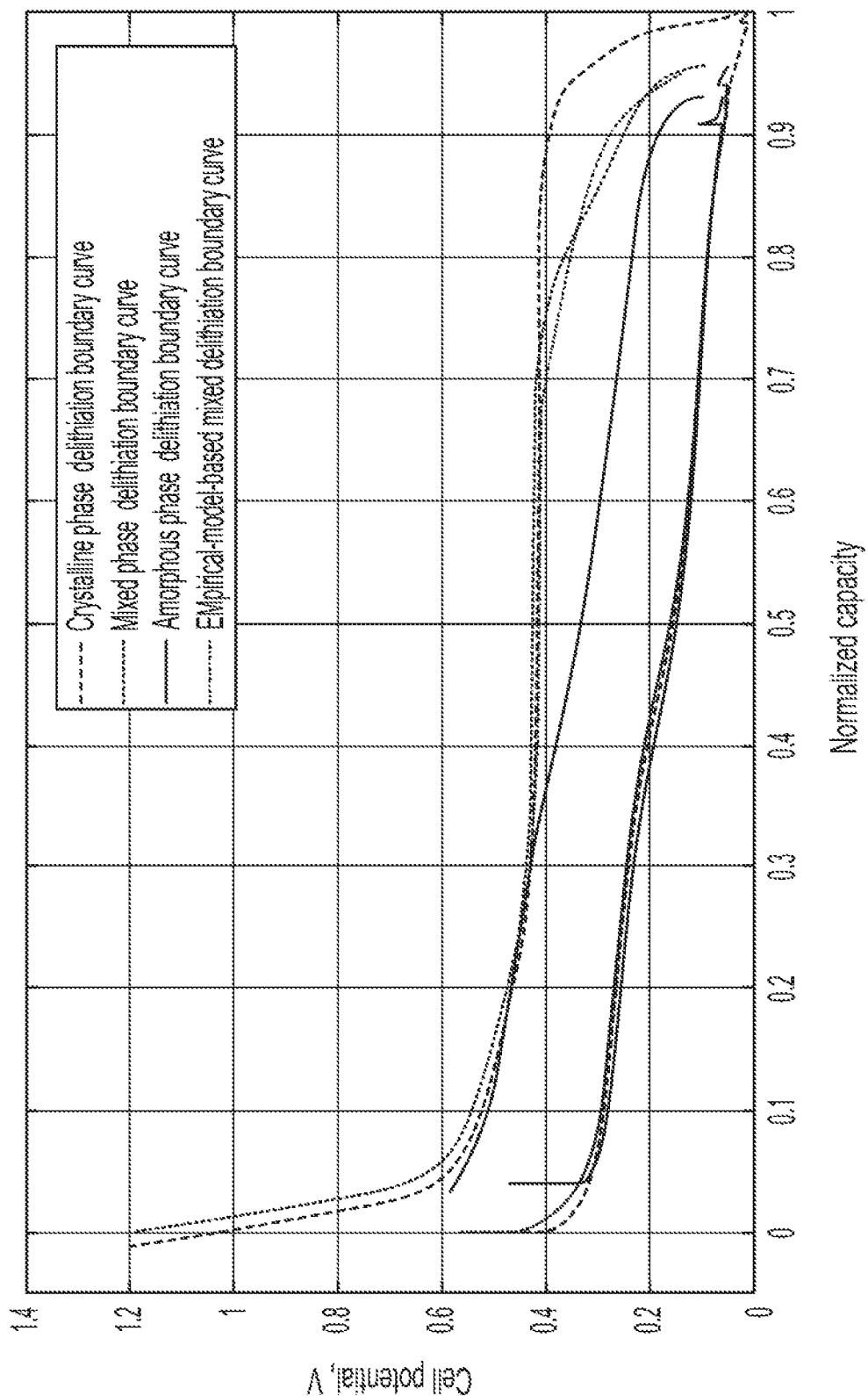
FIG. 12 is a graph depicting the performance of empirical model for capturing phase change related effects on the delithiation boundary curves for a silicon half-cell.
Figure 13:
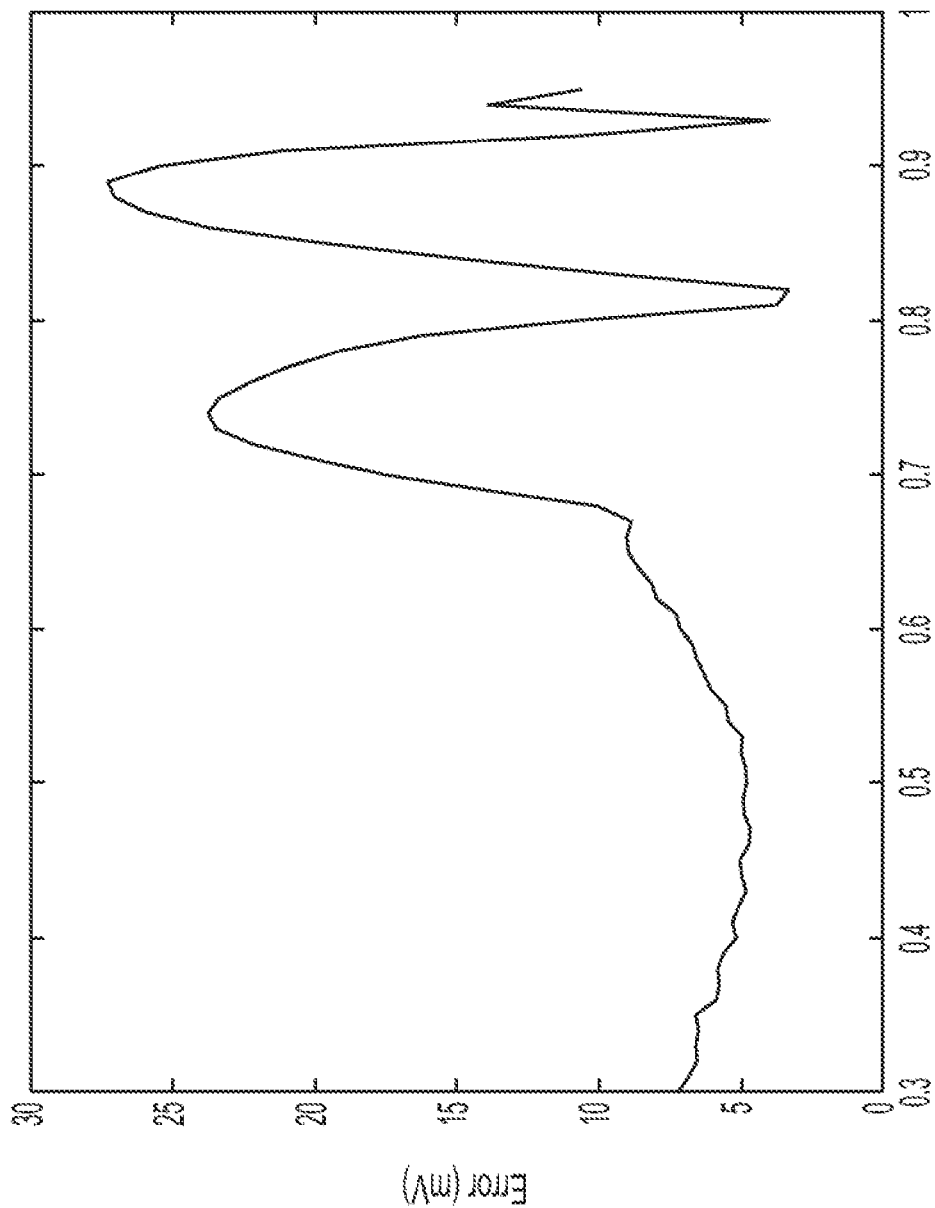
FIG. 13 is a graph depicting an example of the error between an experimental delithiation boundary curve for a mixed-phase silicon half-cell and a boundary curve prediction model.

The function h: $[0,1] \rightarrow R_{[\geq 0]}$ is parameterized according to experimental data. FIG. 12 overlays the prediction from the empirical model using equations (I) and (V) and the rule for modifying the delithiation boundary curve based on the phase fraction as set forth in equation (VI). FIG. 13 depicts an example of the error between the experimental delithiation boundary curve for a mixed-phase silicon half-cell and the prediction model. As demonstrated by FIGS. 12 and 13, the model prediction closely matches the observed experimental data for the case where the half-cell potential during lithiation reaches a value of between 0 and 70 mV. The root-mean-square error for this case is approximately 13 mV.

The proposed battery management systems and processes described herein effectively capture the lithiation/delithiation properties of Si-containing materials by properly accounting for voltage relaxation behavior and phase change effects.

First, the battery management systems and processes of one or more embodiments provide improved voltage prediction and increased accuracy of both SOC estimation and power prediction. Because algorithms for accurate SOC estimation and power prediction rely on voltage error feedback—between model predicted voltage and measured cell voltage—augmenting the electrochemical model with empirical models for describing Si-based materials yields better voltage prediction.

Second, the battery management systems and processes of one or more embodiments provide better prediction of internal states, which facilitates better design of fast charging computer-implemented algorithms. Computer-implemented algorithms for fast charging based on electrochemical battery models rely on accurate estimation of the internal states of the model—i.e., negative electrode overpotential— to avoid battery operation in regimes that accelerate the degradation of the battery. It is also feasible to improve the performance of fast charging algorithms by utilizing states that reflect crystal structure change in the cost function for deriving optimal charging protocols.

Third, the battery management systems and processes of one or more embodiments provide improved voltage prediction and accuracy of state of health (SOH) estimation. The class of model structures described herein can be integrated not only in to electrochemical models but also used to augment other empirical models like the Equivalent Circuit Model (ECM). SOH estimation is a crucial component of a battery management system. Even if the system relies on equivalent circuit models, it is possible to integrate the hysteresis contributions described in embodiments disclosed herein to expand the voltage prediction capability of traditional ECM models. Consequently, for full cells than contain Si-based anodes, incorporating the additional hysteresis elements leads to improved SOH estimation.

Additionally, the battery management systems and processes of one or more embodiments provide accurate accounting of the apparent hysteresis and crystal structure change effects of Si-containing negative electrodes facilitate better battery design and evaluation. Specifically, such battery management systems and processes may allow for less conservative battery design and lower cost.

Embodiments described above, including aspects and combinations thereof, may be incorporated into battery management systems comprising a processor and a memory for storing machine instructions that can be executed by the processor. Such battery management systems may be communicatively coupled to one or more lithium-ion battery cells having a silicon-containing negative electrode. Such battery management systems may also be communicatively coupled to one or more sensors configured to measure certain battery-related parameters such as, but not limited to, voltage, current, resistance, and temperature. The disclosed battery management systems may include, for example, a microcontroller having memory and input/output components on a single, integrated chip or within a single housing. Alternatively, the disclosed battery management systems may include separate processor, memory, and input/output components. The processor may be a commercially-available processing unit that implements an instruction set such as one of the x86, ARM, Power, or MIPS instruction set families. During operation, the processor may execute stored program instructions that are retrieved from the memory. The memory may include volatile memory and non-volatile memory for storing instructions and data. The non-volatile memory may include solid-state memory units, such as NAND flash memory, magnetic and optical storage media, or any other suitable data storage device that retains data. The volatile memory may include any suitable static or dynamic random-access memory (RAM) that stores program instructions and data.

Embodiments described above, including aspects and combinations thereof, may also be applied to form methods of managing battery systems such as lithium-ion battery systems. These methods may involve the management of battery systems that include at least one battery cell having a silicon-containing negative electrode and one or more sensors configured to measure certain battery-related parameters such as, but not limited to, voltage, current, resistance, and temperature. Consistent with the present disclosure, methods of managing battery systems may further involve method steps carried out by a battery management system, which may include one or more processors and memory units such as those described above.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A battery management system comprising a processor and a memory storing instructions that, when executed by the processor, cause the battery management system to:
   receive, from a sensor, at least one measured parameter of a battery cell having a silicon-containing negative electrode;
   determine a first estimated state of charge of the battery cell at a first time based on the at least one measured parameter and amorphous and crystalline phase fractions of one or more materials included in the silicon-containing negative electrode;
   determine an estimated parameter of the battery cell based on the at least one measured parameter and the first estimated state of charge of the battery cell;
   determine a second estimated state of charge of the battery cell at a second time subsequent to the first time based on the estimated parameter of the battery cell by applying a battery model; and
   control the charging or discharging of the battery cell based at least in part on the first and second estimated states of charge of the battery cell.

2. The battery management system of claim 1, wherein the at least one measured parameter of the battery cell having a silicon-containing negative electrode is a voltage of the battery cell.

3. The battery management system of claim 1, wherein the at least one measured parameter of the battery cell having a silicon-containing negative electrode is an applied current.

4. The battery management system of claim 1, wherein the estimated parameter of the battery cell is a voltage of the battery cell.

5. The battery management system of claim 1, wherein the estimated parameter of the battery cell is a power of the battery cell.

6. The battery management system of claim 1, wherein the instructions, when executed by the processor, cause the battery management system to determine the first estimated state of charge of the battery cell at the first time based on the at least one measured parameter, a voltage relaxation behavior of the battery cell, and the amorphous and crystalline phase fractions of the one or more materials included in the silicon-containing negative electrode.

7. A lithium-ion battery management system, the system comprising at least one battery cell having a silicon-containing negative electrode, a processor and a memory storing instructions that, when executed by the processor, cause the battery management system to:
   receive, from a sensor, at least one measured parameter of the battery cell having a silicon-containing negative electrode;
   determine a first estimated state of charge of the battery cell at a first time based on the at least one measured parameter by considering a voltage relaxation behavior of the battery cell based at least in part on lithiation or delithiation properties of the silicon-containing negative electrode and further applying an ordinary differential equation capturing an evolution of a hysteresis voltage of the battery cell;
   determine an estimated parameter of the battery cell based on the at least one measured parameter and the first estimated state of charge of the battery cell;
   determine a second estimated state of charge of the battery cell at a second time subsequent to the first time based on the estimated parameter of the battery cell by applying a battery model; and
   control the charging or discharging of the battery cell based at least in part on the first and second estimated states of charge of the battery cell.

8. The battery management system of claim 7, wherein the at least one measured parameter of the battery cell having a silicon-containing negative electrode is a voltage of the battery cell.

9. The battery management system of claim 7, wherein the at least one measured parameter of the battery cell having a silicon-containing negative electrode is an applied current.

10. The battery management system of claim 7, wherein the ordinary differential equation is the following equation:

$$\frac{dV_h}{dt} = \beta_1 I(V_{hmax1}(SOC) - \text{sign}(I)V_h) + S_1 * \beta_2(V_{hmax2}(SOC) * S_2 - V_h)$$

where $V_h(t)$ is a hysteresis voltage at time t, $I(t)$ is an applied current at time t, $SOC(t)$ is a state of charge at time t, $S_1(t)=0$ if $I(t) \neq 0$ and $S_1(t)=1$ otherwise, $S_2(t)=1$ if $I(t^-)>0$ and $I(t)=0$ or $S_2(t)=1$ if $I(t^-)<0$ and $I(t)=0$ or $S_2(t)=0$ otherwise, $V_{hmax1}$ is a first deviation of an outer boundary curve from a mean curve as a function of SOC, $V_{hmax2}$ is a second deviation of an inner boundary curve from the mean curve as a function of SOC, $\beta_1$ defines a first convergence rate from the inner boundary curve to the outer boundary curve, and $\beta_2$ defines a second convergence rate from the outer boundary curve to the inner boundary curve.

11. The battery management system of claim 7, wherein the ordinary differential equation is the following equation:

$$\frac{dV_h}{dt} = \beta_2 I(V_{hmax2}(SOC) - \text{sign}(I)V_h)$$

where $V_h(t)$ is a hysteresis voltage at time t, I(t) is an applied current at time t, SOC(t) is a state of charge at time t, $V_{hmax2}$ is a deviation of an inner boundary curve from a mean curve as a function of SOC, and $\beta_2$ defines a convergence rate from an outer boundary curve to the inner boundary curve.

12. The battery management system of claim 7, wherein the estimated parameter of the battery cell is a voltage of the battery cell.

13. The battery management system of claim 7, wherein the estimated parameter of the battery cell is a power of the battery cell.

14. A method of operating a lithium-ion battery system, the system including at least one battery cell having a silicon-containing negative electrode, a sensor configured to measure at least one parameter of the battery cell having a silicon-containing negative electrode, and a battery management system including a processor and a memory, the method comprising:
  receiving, by the processor of the battery management system, an at least one measured parameter of the battery cell measured by the sensor;
  determining, by the processor of the battery management system, a first estimated state of charge of the battery cell at a first time based on the at least one measured parameter by applying a battery model describing an ordinary differential equation capturing an evolution of a hysteresis voltage of the battery cell;
  determining, by the processor of the battery management system, an estimated parameter of the battery cell based on the at least one measured parameter and the first estimated state of charge of the battery cell;
  determining, by the processor of the battery management system, a second estimated state of charge of the battery cell at a second time subsequent to the first time based on the estimated parameter of the battery cell by applying the battery model; and
  controlling the charging or discharging of the battery cell based at least in part on the first and second estimated states of charge of the battery cell.

15. The method of claim 14, wherein the at least one measured parameter of the battery cell having a silicon-containing negative electrode is a voltage of the battery cell.

16. The method of claim 14, wherein the ordinary differential equation is the following equation:

$$\frac{dV_h}{dt} = \beta_1 I(V_{hmax1}(SOC) - \text{sign}(I)V_h) + S_1 * \beta_2(V_{hmax2}(SOC) * S_2 - V_h)$$

where $V_h(t)$ is a hysteresis voltage at time t, I(t) is an applied current at time t, SOC(t) is a state of charge at time t, $S_1(t)=0$ if $I(t)\neq 0$ and $S_1(t)=1$ otherwise, $S_2=1$ if $I(t^-)>0$ and $I(t)=0$ or $S_2(t)=1$ if $I(t^-)<0$ and $I(t)=0$ or $S_2(t)=0$ otherwise, $V_{hmax1}$ is a first deviation of an outer boundary curve from a mean curve as a function of SOC, $V_{hmax2}$ is a second deviation of an inner boundary curve from the mean curve as a function of SOC, $\beta_1$ defines a first convergence rate from the inner boundary curve to the outer boundary curve, and $\beta_2$ defines a second convergence rate from the outer boundary curve to the inner boundary curve.

17. The method of claim 14, wherein the ordinary differential equation is the following equation:

$$\frac{dV_h}{dt} = \beta_2 I(V_{hmax2}(SOC) - \text{sign}(I)V_h)$$

where $V_h(t)$ is a hysteresis voltage at time t, I(t) is an applied current at time t, SOC(t) is a state of charge at time t, $V_{hmax2}$ is a deviation of an inner boundary curve from a mean curve as a function of SOC, and $\beta_2$ defines a convergence rate from an outer boundary curve to the inner boundary curve.

18. The method of claim 14, wherein the at least one measured parameter of the battery cell having a silicon-containing negative electrode is an applied current.

19. The method of claim 14, wherein the estimated parameter of the battery cell is a voltage of the battery cell.

20. The method of claim 14, wherein the estimated parameter of the battery cell is a power of the battery cell.

* * * * *

UNITED STATES PATENT AND TRADEMARK OFFICE
CERTIFICATE OF CORRECTION

PATENT NO. : 11,342,594 B2
APPLICATION NO. : 16/699218
DATED : May 24, 2022
INVENTOR(S) : Subbaraman et al.

It is certified that error appears in the above-identified patent and that said Letters Patent is hereby corrected as shown below:

In the Claims

Column 16, Line 16, Claim 16:
After "$S_1(t)=1$ otherwise,"
Delete "$S_2=1$"
Insert --$S_2(t)=1$--.

Column 16, Line 17, Claim 16:
After "and $I(t)=0$ or"
Delete "$S_2(t)=1$"
Insert --$S_2(t)=-1$--.

Signed and Sealed this
Twenty-third Day of May, 2023

*Katherine Kelly Vidal*

Katherine Kelly Vidal
*Director of the United States Patent and Trademark Office*